United States Patent [19]

Saito

[11] Patent Number: 4,761,769
[45] Date of Patent: Aug. 2, 1988

[54] MOS READ-ONLY MEMORY DEVICE

[75] Inventor: Kaoru Saito, Tokyo, Japan

[73] Assignee: Oki Electric Industry Co., Ltd., Tokyo, Japan

[21] Appl. No.: 890,482

[22] Filed: Jul. 29, 1986

[30] Foreign Application Priority Data

Aug. 2, 1985 [JP] Japan .................. 60-170868

[51] Int. Cl.$^4$ .................................... G11C 7/00
[52] U.S. Cl. ...................... 365/230; 365/203
[58] Field of Search ............ 365/189, 203, 230, 233, 365/94, 104

[56] References Cited

U.S. PATENT DOCUMENTS 4,417,328 11/1983 Ochii .............................. 365/203
4,592,028 5/1986 Konishi ........................... 365/230

FOREIGN PATENT DOCUMENTS 50-7896 3/1975 Japan .
56-165983 12/1981 Japan .
57-13079 3/1982 Japan .

OTHER PUBLICATIONS

"Introduction to VLSI System" C. Mead & L. Conway, pp. 79–82.

Primary Examiner—Joseph A. Popek
Attorney, Agent, or Firm—Wenderoth, Lind & Ponack

[57] ABSTRACT

An MOS type read-only memory device having a reduced power consumption has a clock signal generator circuit for generating a pair of positive and negative clock signals by detecting a change of an address signal in the ROM having MOS transistors used as a load and connected to bit lines, a tri-state circuit including an input, a control signal input, and an ouput; the tri-state circuit has its output impedance made higher due to a clock signal supplied to the control signal input. The device also has a switching circuit for keeping the MOS transistors used as a load in their active state based on a clock signal. The inputs and outputs of the tri-state circuit are each connected to the bit lines and gates of the MOS transistors used as a load. The switching circuit is connected to the gate side of the MOS transistors used as a load.

6 Claims, 7 Drawing Sheets

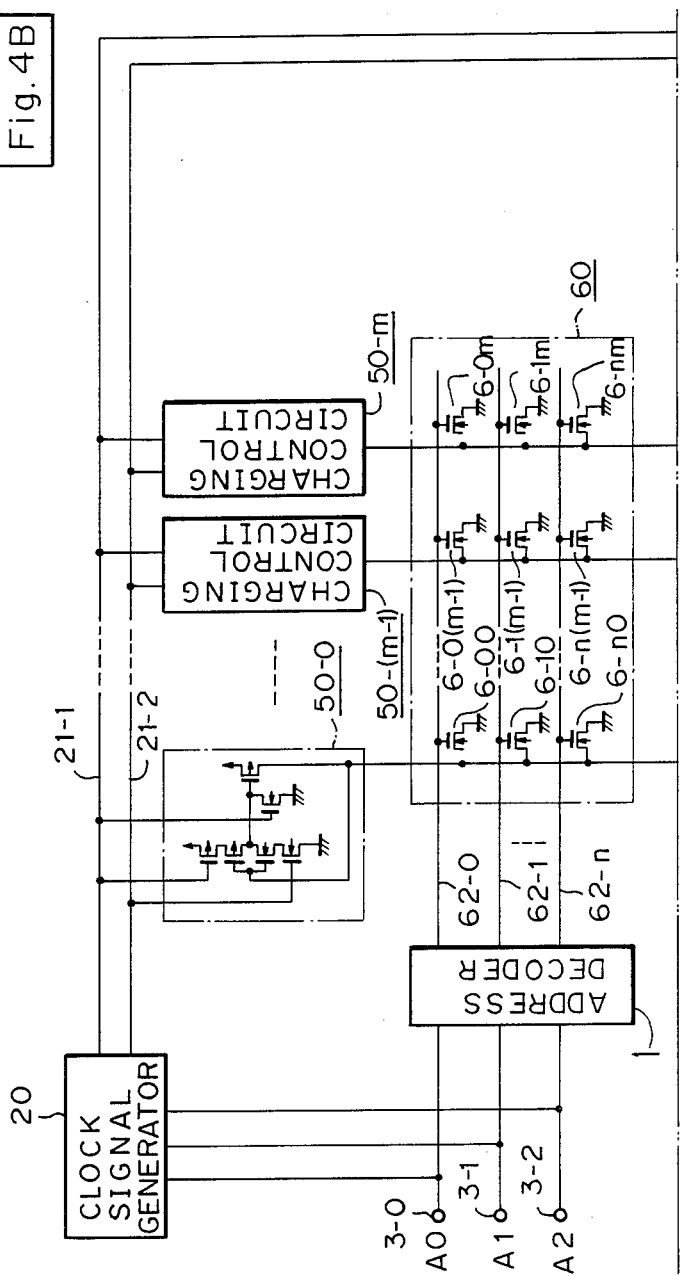

4,761,769

MOS READ-ONLY MEMORY DEVICE

BACKGROUND OF THE INVENTION

1. Field of the Invention

This invention relates to an MOS read-only memory device (hereinafter referred to as a ROM device) comprising MOS transistors.

2. Description of the Prior Art

Prior are MOS ROM devices are disclosed, for example, in Japanese Patent Publication Nos. 50-7896 and 57-13079, and Japanese Laid-open Patent Publication No. 56-165983. Such a MOS ROM device is illustrated in FIG. 1 and its arrangement will be explained in detail with reference to the accompanying drawing.

In FIG. 1, a prior art MOS ROM device having 8 words×(m+1) bits structure is shown which consists of a 3-input/8-output address decoder 1 and a NOR type memory cell matrix 2 having a 8 words×(m+1) bits structure.

The address decoder 1 has its inputs connected to address input terminals 3-1 to 3-2 and its output connected to word lines 4-0 to 4-6 and decodes the coded address signals A0 to A2 to select one of the word lines 4-0 to 4-6.

The memory cell matrix 2 has the word lines 4-0 to 4-6, the bit lines 5-0 to 5-$m$ and a plurality if N-channel MOS transistors 6-00 to 6-6$m$ connected at cross points of the word and bit lines. Each of the NMOS transistors 6-00 to 6-6$m$ has its drain electrode connected to the bit line, its gate electrode connected to the word line and its source electrode grounded to Vss (0 volts).

The respective bit lines 5-1 to 5-$m$ are connected at one end to P-channel MOS transistors 7-0 to 7-$m$ and connected at the other end to sense circuits 8-0 to 8-$m$ each comprising an inverter. The PMOS transistors have their drain electrodes connected to a source voltage VDD, and their gate electrodes connected to the ground potential VSS.

The sense circuits 8-0 to 8-$m$ respectively have inputs connected to the bit lines 5-0 to 5-$m$ and have output terminals 9-0 to 9-$m$ and read out the signals on the bit lines 5-0 to 5-$m$ to deliver output signals O0 to Om to their output terminals 9-0 to 9-$m$.

The operation of the prior art MOS ROM device is described below.

First, it is assumed that all of the MOS transistors 6-00, 6-0(m−1), 6-11, 6-30, 6-3$m$ and 6-61 are in a written state.

When the address decoder 1 receives address signals A0 to A2, it, for example, selects the word line 4-9, whereby the word line 4-0 becomes an "H" level while the other word lines become an "L" level. As a result, only the MOS transistors 6-00 to 6-0(m−1) connected to the word line 4-0 are switched to make the bit lines 5-0 to 5-0(m−1) an "L" level, while the other bit lines 5-1 to 5-$m$ become an "H" level. The sense circuits 8-0 to 8-$m$ read the signals on the bit lines 5-0 to 5-$m$ to output the inverted signals as output signals O0 to Om. In this case, the output signals O0 and O(m−1) become an "H" level while the other output signals become an "L" level.

However, the prior art ROM device has a disadvantage in that since a source current through MOS transistors associated with a selected word line flows during a read operation, power consumption is increased. In particular, a large scale memory cell matrix including a great number of bits to be selected significantly increases its power consumption during a read operation.

SUMMARY OF THE INVENTION

In view of the disadvantage of the prior art MOS ROM device, it is an object of the present invention to provide an MOS ROM device capable of reducing the power consumed during a read operation.

An MOS ROM device according to the present invention comprises:

(a) a memory cell matrix including a plurality of word lines, a plurality of bit lines and a plurality of MOS transistors, said word lines and said bit lines being in a matrix form, said MOS transistors being selectively connected between said word lines and bit lines;

(b) an address decoder connected to said memory cell matrix for selecting one of said word lines in response to address signals;

(c) a clock signal generating circuit for supplying a pair of positive and negative clock signals $\phi$ and $\bar{\phi}$ to first and second signal lines by detecting a level change of any one of said address signals, said clock signals $\phi$ and $\bar{\phi}$ having a prescribed pulse width; and (d) a plurality of charging control circuits each connected to said first and second signal lines for providing a charging current to one of said bit lines, each of said charging control circuits including a load MOS transistor having a gate electrode, a first electrode connected to a first power source and a second electrode connected to one of said bit lines; an MOS switching transistor having a gate electrode connected to said first signal line, a first electrode connected to a second power source and a second electrode connected to said gate electrode of said load MOS transistor; and a tri-state circuit having an input connected to said one of said bit lines and an output connected to said gate electrode of said load MOS transistor, a first control input connected to said first signal line, and a second control input connected to said second signal line, whereby when said pair of clock signals $\phi$ and $\bar{\phi}$ are supplied to said tri-state circuit so as to make its output a high impedance, said load MOS transistor charges said one of said bit lines during a prescribed period.

An MOS programmable logic array device according to the present invention comprises:

(a) a first memory cell matrix having a plurality of word lines, a plurality of product-term lines and a plurality of MOS memory transistors each being disposed at an intersection of each of said word lines and each of said product-term lines;

(b) a second memory cell matrix having a plurality of output lines, said plurality of product-term lines and a plurality of MOS memory transistors, each of which is disposed at an intersection of each of said output lines and each of said product-term lines;

(c) an address decoder connected to said word lines of said first memory cell matrix for selecting one of said word lines in response to address signals;

(d) a clock signal generating circuit for detecting a level change of any one of said address signals and for supplying a pair of positive and negative clock signals $\phi$ and $\bar{\phi}$ to first and second signal lines, each of said clock signals having a prescribed pulse width; and (e) a plurality of charging control circuits connected to said product-term lines and said output lines, each of said charging control circuits including a load MOS transistor having a gate electrode, a first electrode connected to a first power source and a second electrode connected to one of said product-term or output lines; an MOS switching transistor having a gate electrode connected to said first signal line, a first electrode connected to a second power source and a second electrode connected to said gate electrode of said load MOS transistor; and a tri-state circuit having an output connected to said gate electrode of said load MOS transistor, an input connected to said one of said product-term or output lines, a first control input connected to said first signal line and a second control input connected to said second signal line, whereby when said clock signals $\phi$ and $\bar{\phi}$ are supplied to said tri-state circuit so as to make its output a high impedance, said load MOS transistor charges said one of said product-term lines or said output lines during a prescribed period.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
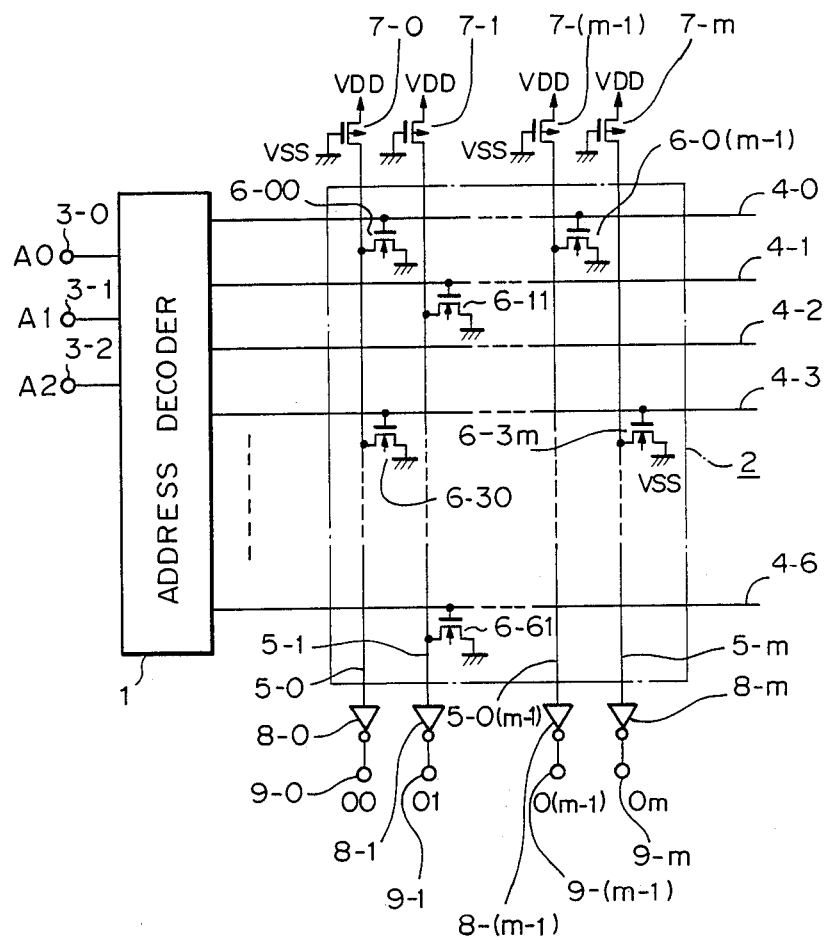
FIG. 1 is a circuit block diagram of a prior art MOS ROM device.
Figure 2A:
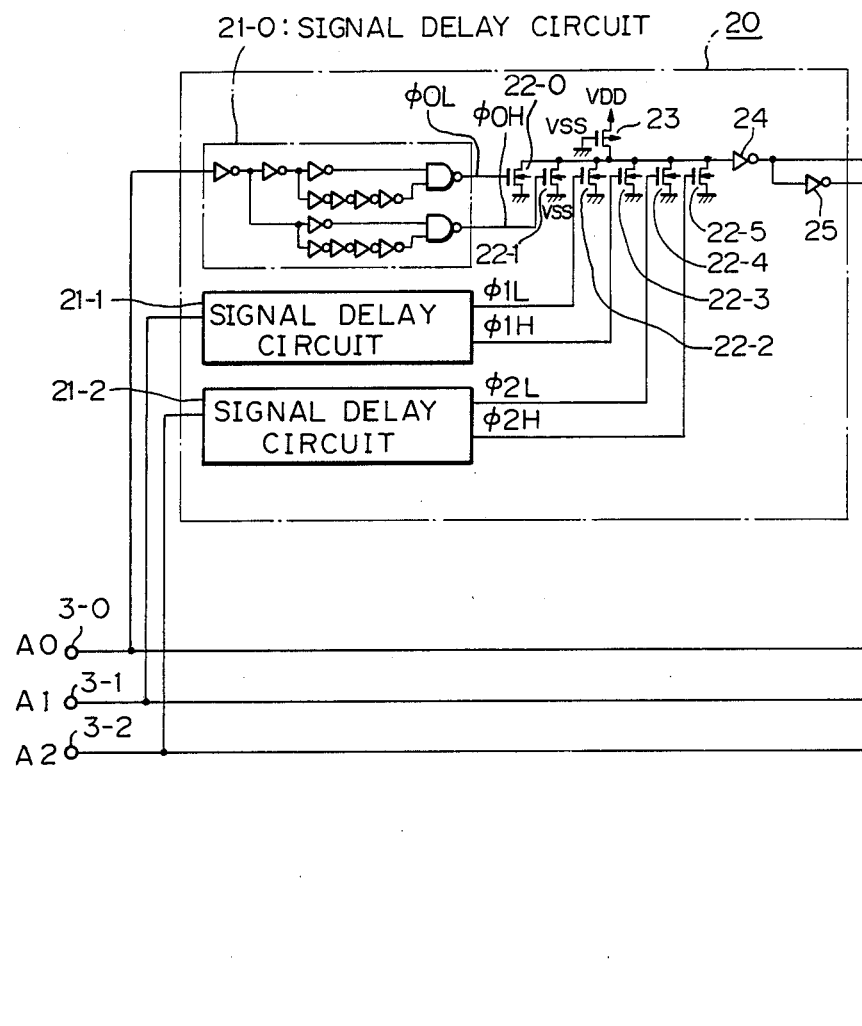
FIG. 2, consisting of FIG. 2A and FIG. 2B, is a circuit block diagram illustrating a first embodiment of an MOS ROM device according to the present invention.
Figure 2B:
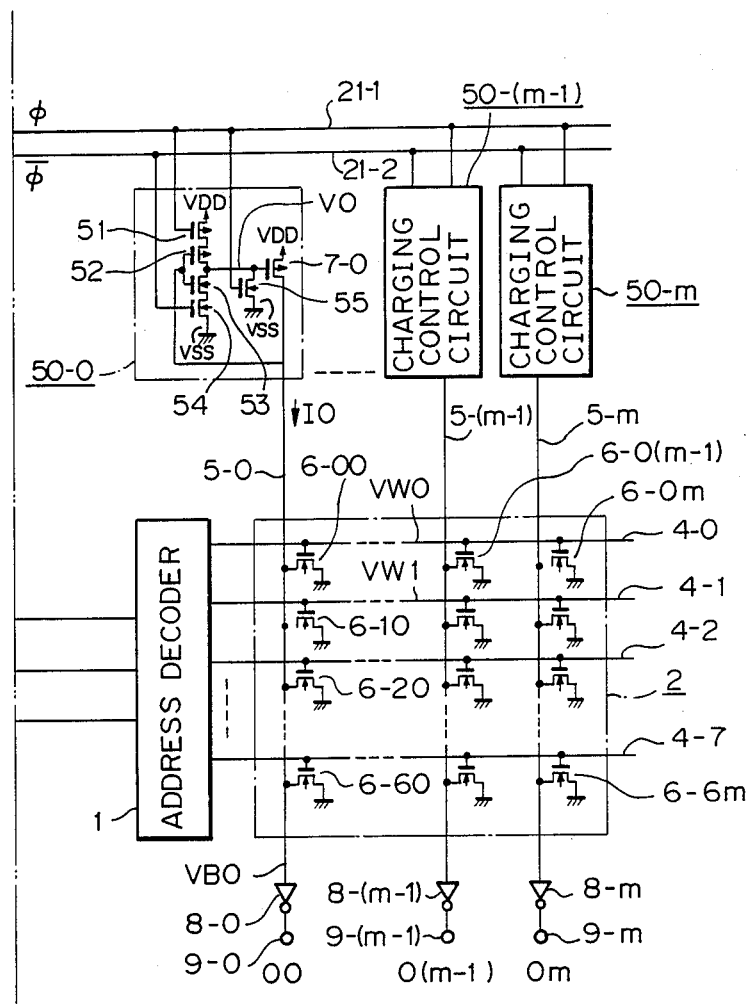

Referring to FIG. 2, the first embodiment of an MOS ROM device according to the present invention is described. The same reference numbers in FIGS. 1 and 2 indicate the same elements and functions.

In FIG. 2, a significant feature is that the MOS ROM device according to the present invention includes a clock signal generating circuit 20 connected to address signal terminals 3-0 to 3-2 for providing a clock signal $\phi$ having a prescribed width to the signal line 21-1 and for providing an inverted clock signal $\bar{\phi}$ to the signal line 21-2, and a plurality of charging control circuits 50-0 to 50-$m$ each connected to the signal lines 21-1 and 21-2 for charging the bit line 5.

The clock signal generating circuit 20 detects a voltage change in at least one of the address signals to generate a pair of positive and negative clock signals $\phi$ and $\bar{\phi}$ having a prescribed pulse width. Such circuits, for example, are disclosed in Japanese Laid-Open Patent Publication No. 56-165983.

The clock signal generating circuit 20 also has a plurality of signal delay circuits 21' comprising a plurality of inverters and NAND gates, a plurality of NMOS transistors 22, a PMOS transistor 23, and inverters 24 and 25. The signal delay circuits 21'-0 to 21'-2 receive the address signals A0 to A2 to produce delayed delayed signals $\phi$0L to $\phi$2L and $\phi$0H to $\phi$2H, respectively to the gate electrodes of the NMOS transistors 22. The NMOS transistors 22 have their drain electrodes connected together and have their source electrodes connected to the ground VSS and the PMOS transistor 23 has its drain electode connected to the drain electrodes of the NMOS transistors 23, and has its source electrode connected to a power source VDD and has its gate electrode connected to the potential VSS. The inverter 14 is connected to the drain electrodes of the NMOS transistors 24 to produce a clock signal $\phi$ and the inverter 25 connected to the inverter 24 to produce a clock signal $\bar{\phi}$ inverted.

In the clock signal generating circuit 20, when at least one of address signals A0 to A2 changes to an "L" level from an "H" level, the corresponding signal delay circuit 21' produces an "L" level signal, while when at least one of address signals A0 to A2 changes to an "L" level from an "H" level, the corresponding delay circuit produces an "H" level signal. The inverters 24 and 25 sequentially produces the clock signals $\phi$ and $\bar{\phi}$ having a prescribed pulse width on the occurrence of any one of signals $\phi$01 to $\phi$2L and $\phi$0H to $\phi$2H. The pulse widths of the clock signals $\phi$ and $\bar{\phi}$ are determined by the load characteristics of the PMOS transistor 23.

The charging control circuit 50 comprises a tri-state circuit composed of PMOS transistors 51 and 52 and NMOS transistors 53 and 54 serially connected to each other, a switching circuit composed of an NMOS transistor 55, and a PMOS transistor 7-0 used as an MOS load element. The PMOS transistor 51 has its source electrode connected to a power source VDD, and has its gate electrode connected to the signal line 21-1, and has a drain electrode and the PMOS transistor 52 has its gate electrode connected to the bit line 5-0, and has its source electrode connected to the drain electrode of the PMOS transistor 51 and has its drain electrode connected to an output node. The NMOS transistor 53 has its drain electrode connected to the output node, and has its gate electrode connected to the bit line 5-0 and has its source electrode and the NMOS transistor 54 has its drain electrode connected to the source electrode of the NMOS transistor 53, and has its gate electrode connected to the signal line 21-2, and has its source electrode connected to the potential VSS. When the tri-state circuit receives the clock signals $\phi$ and $\bar{\phi}$, its output impedance becomes high. On the other hand, when the tri-state circuit receives no clock signals $\phi$ and $\bar{\phi}$, it provides an "H" or "L" level signal at its output node in accordance with a signal on the bit line 5.

The PMOS transistor 7-0 has its source electrode connected to the power source VDD, and has its gate electrode connected to the output node of the tri-state circuit and has its drain electrode connected to the bit line 5.

The NMOS transistor 55 acting as a switching circuit has its drain electrode connected to the output node of the tri-state circuit, and has its gate electrode connected to the signal line 21-1 and has its source electrode connected to the potential VSS and causes the PMOS transistor 7-0 to become active based on the clock signal $\phi$.

The operation of the MOS ROM device shown in FIG. 2 will be described with reference to signal waveforms depicted in FIG. 3.

Figure 3:
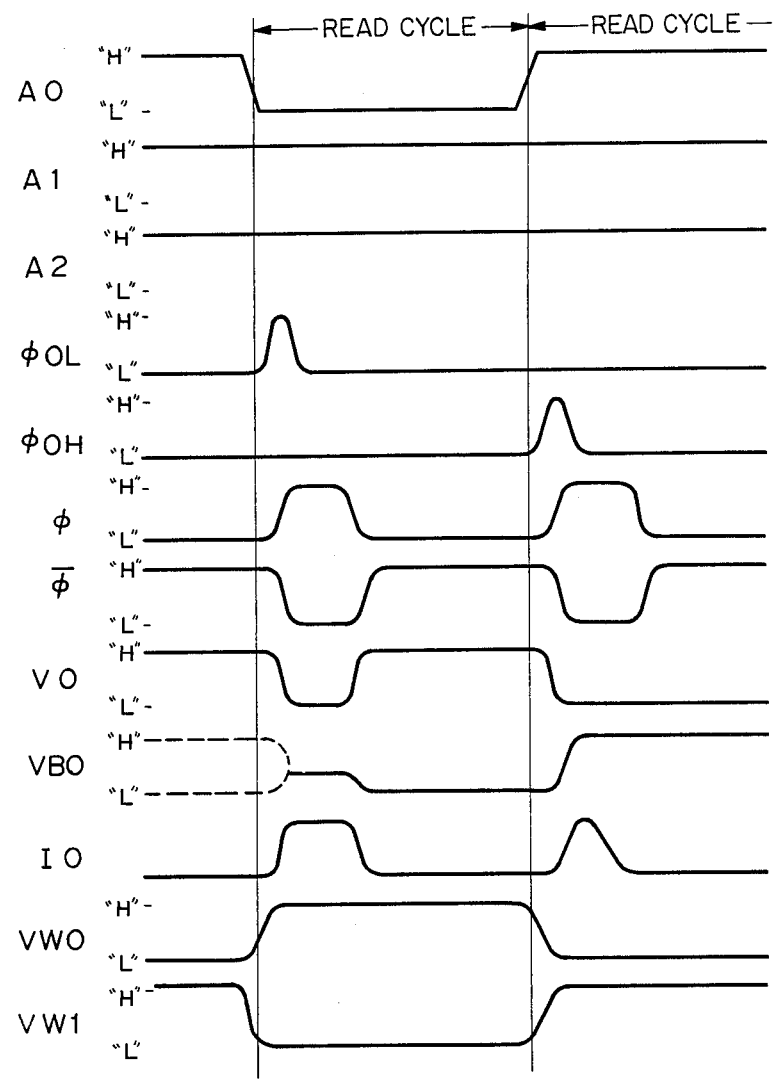
FIG. 3 is a timing chart illustrating signal waveforms at various nodes of the circuit FIG. 2.

At a starting stage, as shown in FIG. 3, it is assumed that the address signals A0, A1 and A2 are at an "H" level, respectively, the clock signals $\phi$ and $\bar{\phi}$ are at an "L" and "H" level, respectively, the signals $\phi$0L and $\phi$0H are at an "L" level, respectively, and the potential V0 on the output node of the tri-state circuit is an "H" level.

The potential VBO on the bit line 5 becomes unsettlement and no current exists in the bit line.

In the memory cell matrix 2, the NMOS transistors 6-00 and 6-0(m−1) have their drains connected to the bit lines 5-9 and 5-0(m−1), respectively, and are in a data written condition.

In a read operation, when the address signal A0 turns into an "L" level, the potential VW0 on the word line 4-0 changes from a "L" level to "H" level, whereby both the NMOS transistors 6-00 and 6-0(m−1) become conductive. At the same time, since the signal delay circuit 21-9 outputs a pulse signal φOL in response to a level change in the address signal A0, the clock signal generating circuit 20 produces the clock signal φ of an "H" level and the clock signal $\bar{\phi}$ of an "L" level is fed to the charging control circuit 50 (see FIG. 3).

In the charging control circuit 50-0, for example, the NMOS transistor 55 becomes conductive and the PMOS transistor 51 and the NMOS transistor 54 become non-conductive. Therefore, the PMOS transistor 7-0 becomes conductive to make the bit line 5-0 at the power potential VDD, whereby a current IO flows to the ground through the NMOS transistor 6-00 and the potential VBO on the bit line 5-0 which is defined by the ratio between ON resistances of the PMOS transistor 7-0 and the NMOS transistor 6-0 finally becomes an "L" level. The "L" level potential is supplied to the gate electrode of the PMOS transistor 52 and the NMOS transistor 53. The gate of the PMOS transistor 7-0 is maintained at an "L" level since the tri-state circuit is in a high impedance state.

Next, when the clock signals φ and $\bar{\phi}$ turn to an "L" level and an "H" level, respectively, after a prescribed time, the NMOS transistor 55 is switched off and both the PMOS and NMOS transistors 56 and 54 are switched on to release the tri-state circuit from the high impedance state. Both the PMOS transistor 52 and the NMOS transistor 53 invert the "L" level potential on the bit line 5-0 to provide to the gate electrode of the PMOS transistor 7-0 an "H" level potential which make the PMOS transistor 7-0 off. As a result, the "L" level potential VBO on the bit line 5-0 approaches the potential VSS and is held in the state. The sensing circuit 8-0 receives the "L" level signal and provides its inverted signal to the output terminal 9-0.

Then, as seen FIG. 3, when the address signal A0 turns to an "H" level, the address decoder 1 selects the word line 4-1, while the clock signal generating circuit 20 produces an "H" level clock signal φ and an "L" level clock signal $\bar{\phi}$ in response to the pulse signal φOH from the signal delay circuit 21-0. In the charging control circuit 50-0, both the NMOS transistor 55 and the PMOS transistor 7-0 become on and start charging to the bit line 5-0. Since no memory MOS transistors in a written state is between the bit line 5-0 and the word line 4-1, the potential VBO on the bit line 5-0 becomes an "H" level and is supplied to the gate electrodes of the PMOS and NMOS transistors 52 and 53.

After a predetermined time, when the clock signals φ and $\bar{\phi}$ turn to "L" and "H" levels, respectively, both the PMOS transistor 52 and the NMOS transistor 53 invert the "H" level bit line potential VBO to provide an "L" level potential to the gate of the PMOS transistor 7-0, whereby the PMOS transistor 7-0 maintains its conductive state to hold the bit line 5-0 to an "H" level. The sensing circuit 8 receives the "H" level signal and provides the inverted signal to the output terminal 9.

As described above, in the embodiment according to the present invention, since a charging current flows in the bit line 5 only at a level change in the address signals, the operational power consumption can be significantly reduced during a read operation.

Figure 4B:
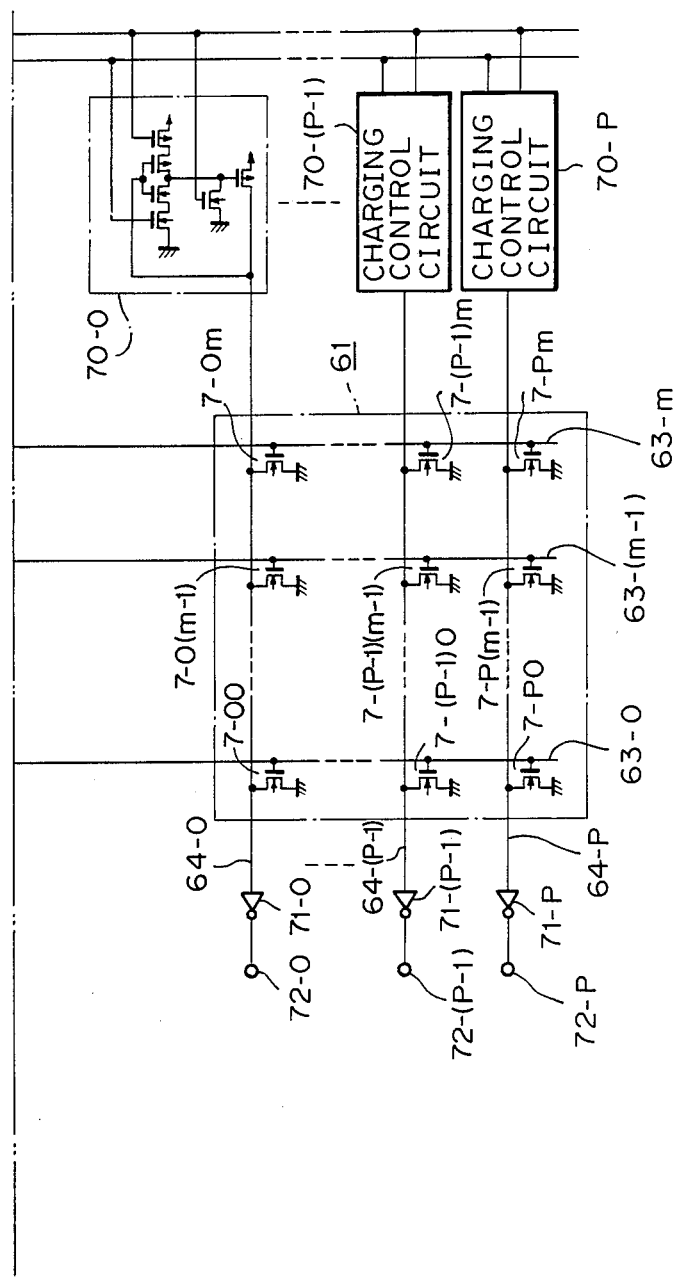
FIG. 4, consisting of FIG. 4A and FIG. 4B, is a circuit block diagram illustrating a second embodiment of an MOS ROM device including a PLA according to the present invention.

In FIG. 4, a circuit diagram of a programmable logic array (PLA) of the present invention is depicted. In FIGS. 3 and 4, the same designation is used to identify the same element.

The PLA has memory cell matrixes 60 and 61 in a form of an NOR structure. The memory cell matrix 60 has a plurality of word lines 62-0 to 62-n connected to the address decoder 1, a plurality of product-term lines 63 connected to the charging control circuits 50 and a plurality of MOS memory transistors 6. The memory cell matrix 61 has a plurality of output lines 64, a plurality of product-term lines 63 and a plurality of MOS memory transistors 7.

The charging control circuits 79 are connected to the output lines 64, respectively. The sensing circuits 71 are connected to the output lines 64, respectively.

In the PLA, an AND logic plane is formed by the memory cell matrix 60 and the address decoder 1 and an OR logic plane is formed by the memory cell matrix 61 and the sensing circuits 71. For example, when all the address signals A0 to A2 change to an "L" level, only the word line 62-0 becomes in an "H" level and when an address signal A0 changes to an "H" level, the word line 62-1 becomes at an "H" level. The function of the charging control circuit is the same as that seen in FIG. 2.

Operation of the PLA according to the present invention will be described with reference to waveforms depicted in FIG. 5.

It is assumed that all the address signals A0 to A2 are at an "L" level, the word line 62-0 is at an "H" level, the word lines 62-1 and 62-n are at an "L" level, the product-term line 63-(m−1) is at an "L" level, the product-term lines 63-0 and 63-m are at an "H" level and all of the output lines 64 are at an "L" level.

First, when the address signal A0 changes to an "H" level in a read operation, the address decoder 1 selects the word line 62-1 to make it an "H" level so that the NMOS transistors 6-10 and 6-1(m−1) become conductive and the potential of the word line 62-0 goes down from an "H" level to an "L" level. At the same time, the clock signal generating circuit 20 produces a clock signal $\bar{\phi}$ of an "H" level and a clock signal φ of an "L" level in response to a change in an address signal for a predetermined period to the charging control circuits 50 and 70.

Then, the charging control circuit 50-m, for example, makes the product-term line 63-m an "H" level. Since the product-term line 63-m is not connected to the drain electrode of the MOS transistor 6-1m, the charging control circuit 50-m maintains the product-term line 63-m at an "H" level. As a result, no charging current flows in the product-term line 63-m.

On the other hand, a charging current $I_{63-0}$ flows the product-term line 63-0 through the MOS transistor 6-10 during the occurrence of the clock signal, while a charging current $I_{63-(m-1)}$ flows the product-term line 63-(m−1) through the MOS transistor 6-1(m−1) for the same period.

Figure 5:
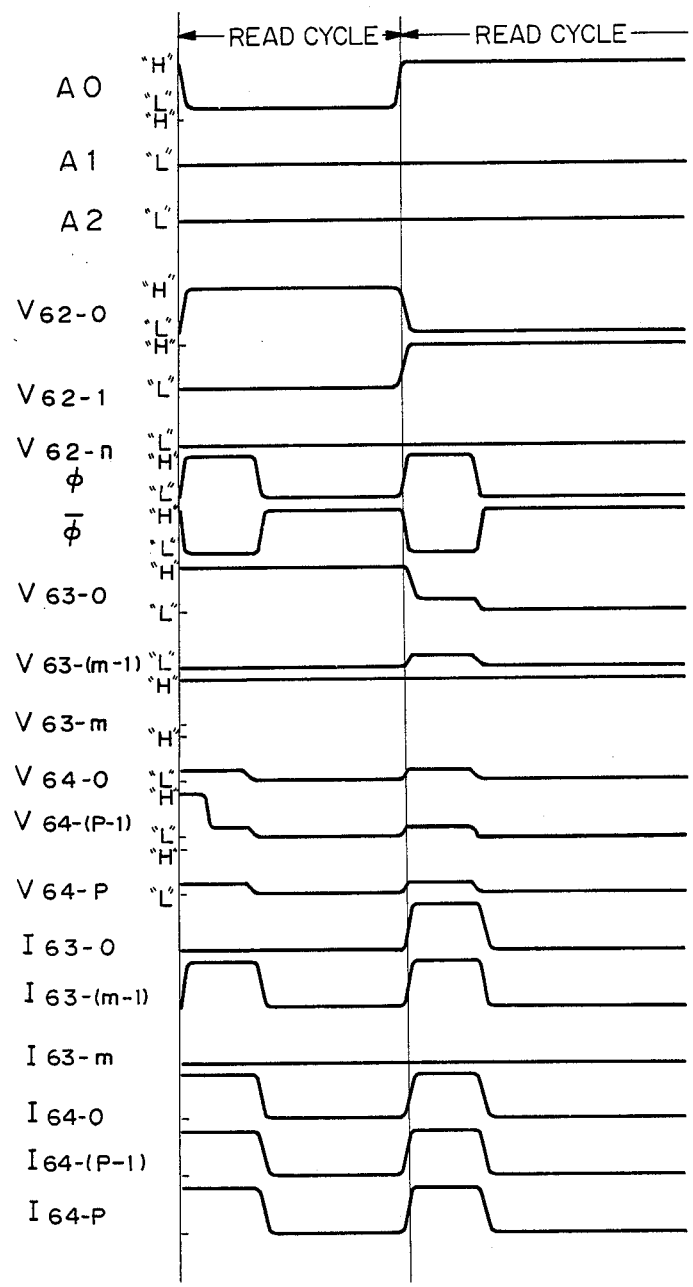
FIG. 5 is a timing chart showing signal waveforms at various nodes in FIG. 4.

Also, since the output line 64-(p−1) is connected to the drain electrode of the MOS transistor 7-(p−1)m, the potential of the output line 64-(p−1) is maintained to an "L" level, whereby a charging current I 64−(p−1) as seen in FIG. 5, flows through the MOS transistor 7−(p−1)m during an "H" level period of the clock signal φ. A charging curring I$_{64-0}$ flows in the output line 64-9 through the MOS transistor 7-0m during a prescribed period, while a charging current I$_{64-p}$ flows in the output line 64-p through the MOS transistor 7-pm for the same period.

In the charging control circuit, for example, the PMOS transistors may be replaced by NMOS transistors in the charging control circuit. The memory cell matrix 2, 60 and 61 may have their number of bits changed in practice.

As described above, according to the present invention, the charging control circuit can control the load MOS transistor connected to the word line in response to a level change of an address signal and allows a charging current to flow in the word line only at the level changing time of an address signal. Therefore, the MOS ROM device according to the present invention can significantly reduce its operational power consumption.

Although certain preferred embodiments have been shown and described, it should be understood that many changes and modifications may be made therein without departing the scope of the appended claims.

What is claimed is:

1. An MOS read-only memory device comprising:
   (a) a memory cell matrix including a plurality of word lines, a plurality of bit lines and a plurality of MOS transistors, said word lines and said bit lines being in a matrix form, said MOS transistors being selectively connected between said word lines and bit lines;
   (b) an address decoder connected to said memory cell matrix for selecting one of said word lines in response to address signals;
   (c) a clock signal generating circuit for supplying a pair of positive and negative clock signals φ and $\overline{\phi}$ to first and second signal lines by detecting a level change of any one of said address signals, said clock signals φ and $\overline{\phi}$ having a prescribed pulse width; and
   (d) a plurality of charging control circuits each connected to said first and second signal lines for providing a charging current to one of said bit lines, each of said charging control circuits including a load MOS transistor having a gate electrode, a first electrode connected to a first power source and a second electrode connected to one of said bit lines; an MOS switching transistor having a gate electrode connected to said first signal line, a first electrode connected to a second power source and a second electrode connected to said gate electrode of said load MOS transistor; and a tri-state circuit having an input connected to said one of said bit lines and an output connected to said gate electrode of said load MOS transistor, a first control input connected to said first signal line, and a second control input connected to said second signal line, whereby when said pair of clock signals φ and $\overline{\phi}$ are supplied to said tri-state circuit so as to make its output a high impedance, said load MOS transistor charges said one of said bit lines during a prescribed period.

2. An MOS read-only memory according to claim 1, wherein said tri-state circuit comprises: a first PMOS transistor having a source electrode, a drain electrode connected to said gate electrode of said load MOS transistor and a gate electrode connected to said one of said bit lines; a second PMOS transistor having a drain electrode connected to said source electrode of said first PMOS transistor, a source electrode connected to said first power source and a gate electrode connected to said first signal line; a first NMOS transistor having a drain electrode connected to said drain electrode of said first PMOS transistor, a source electrode and a gate electrode connected to said one of said bit lines; and a second NMOS transistor having a drain electrode connected to said source electrode of said first NMOS transistor, a source electrode connected to said second power source and a gate electrode connected to said second signal line.

3. An MOS read-only memory according to claim 2, wherein said MOS switching transistor comprises an NMOS transistor.

4. An MOS programmable logic array device comprising:
   (a) a first memory cell matrix having a plurality of word lines, a plurality of product-term lines and a plurality of MOS memory transistors each being disposed at an intersection of each of said word lines and each of said product-term lines;
   (b) a second memory cell matrix having a plurality of output lines, said plurality of product-term lines and a plurality of MOS memory transistors, each of which is disposed at an intersection of each of said output lines and each of said product-term lines;
   (c) an address decoder connected to said word lines of said first memory cell matrix for selecting one of said word lines in response to address signals;
   (d) a clock signal generating circuit for detecting a level change of any one of said address signals and for supplying a pair of positive and negative clock signals φ and $\overline{\phi}$ to first and second signal lines, each of said clock signals having a prescribed pulse width; and
   (e) a plurality of charging control circuits connected to said product-term lines and said output lines, each of said charging control circuits including a load MOS transistor having a gate electrode, a first electrode connected to a first power source and a second electode connected to one of said product-term or output lines; an MOS switching transistor having a gate electrode connected to said first signal line, a first electrode connected to a second power source and a second electrode connected to said gate electrode of said load MOS transistor; and a tri-state circuit having an output connected to said gate electrode of said load MOS transistor, an input connected to said one of said product-term or output lines, a first control input connected to said first signal line and a second control input connected to said second signal line, whereby when said clock signals φ and $\overline{\phi}$ are supplied to said tri-state circuit so as to make its output a high impedance, said load MOS transistor charges said one of said product-term lines or said output lines during a prescribed period.

5. An MOS programmable logic array device according to claim 4, wherein said tri-state circuit comprises: a first PMOS transistor having a gate electrode connected to one of said product-term lines or said output lines, a source electrode and a drain electrode connected to said gate electrode of said load MOS transistor; a second PMOS transistor having a gate electrode connected to said first signal line, a source electrode connected to a first power source and a drain electrode connected to said source electrode of said first PMOS transistor; a first NMOS transistor having a gate electrode connected to said gate electrode of said first PMOS transistor, a drain electrode connected to said drain electrode of said first PMOS transistor and a source electrode; a second NMOS transistor having a gate electrode connected to said second signal line, a source electrode connected to a second power source and a drain electrode connected to said source electrode of said first NMOS transistor.

6. An MOS programmable logic array device according to claim 4, wherein said MOS switching transistor comprises an NMOS transistor.

* * * * *